United States Patent [19]

Watanabe

[11] Patent Number: 5,270,982
[45] Date of Patent: Dec. 14, 1993

[54] DYNAMIC RANDOM ACCESS MEMORY DEVICE IMPROVED IN TESTABILITY WITHOUT SACRIFICE OF CURRENT CONSUMPTION

[75] Inventor: Hiroshi Watanabe, Tokyo, Japan
[73] Assignee: NEC Corporation, Tokyo, Japan
[21] Appl. No.: 875,831
[22] Filed: Apr. 30, 1992

[30] Foreign Application Priority Data

Apr. 30, 1991 [JP] Japan .................................. 3-126652

[51] Int. Cl.$^5$ ............................................... G11C 7/00
[52] U.S. Cl. ....................................... 365/222; 365/201
[58] Field of Search ............. 365/222, 201, 233, 189.05

[56] References Cited

U.S. PATENT DOCUMENTS

| | | | |
|---|---|---|---|
| 4,549,284 | 10/1985 | Ikuzaki | 365/222 |
| 4,672,583 | 6/1987 | Nakaizumi | 365/222 |
| 4,870,620 | 9/1989 | Yamagata et al. | 365/222 |
| 4,985,868 | 1/1991 | Nakano et al. | 365/222 |

Primary Examiner—Eugene R. LaRoche
Assistant Examiner—Tan Nguyen
Attorney, Agent, or Firm—Sughrue, Mion, Zinn, Macpeak & Seas

[57] ABSTRACT

A dynamic random access memory device refreshes data bits stored in the memory cell array thereof, and a self-refresh controller incorporated therein is responsive to an external row address strobe signal and an external column address strobe signal controlled in one of first, second and third sequences for selectively activating component circuits provided in a data path from the bit line pairs and a data terminal, wherein the self-refresh controller only activates parts of the data path used for developing the data bits on the bit line pairs to a restore level in the autorefreshing mode so as to decrease current consumption; however, the self-refresh controller activates all of the component circuits in the data path in the diagnostic mode for carrying out a testing operation on an internal address counter.

5 Claims, 7 Drawing Sheets

DYNAMIC RANDOM ACCESS MEMORY DEVICE IMPROVED IN TESTABILITY WITHOUT SACRIFICE OF CURRENT CONSUMPTION

FIELD OF THE INVENTION

This invention relates to a dynamic random access memory device and, more particularly, to an autorefreshing unit incorporated in the dynamic random access memory device.

DESCRIPTION OF THE RELATED ART

A dynamic random access memory device stores data bits in the memory cells in the form of electric charges, and the electric charges are liable to flow out. Therefore, it is necessary for the dynamic random access memory device to periodically refresh the data bits by sequentially recharging electric charges to the memory cells. Various refreshing sequences have been proposed and applied to commercial produces. One of the autorefreshing sequences is known as "RAS Only Refresh" where rows of the memory cell array are sequentially addressed with an external row address signal fetched in synchronism with the row address strobe signal. Another refreshing sequence is called as "CAS-Before-RAS Autorefresh" where an internal address counter increments an internal address signal indicative of the rows of the memory cell array upon step-down of the column address strobe signal followed by the row address strobe signal. The CAS-Before-RAS autorefreshing is preferable in view of reduction in load of an external control device such as a microprocessor.

Another tendency is that a dynamic random access memory device is implemented by CMOS inverters, and the CMOS inverters effectively decrease electric power consumption of the dynamic random access memory device. The CMOS inverters further allow the dynamic random access memory device to have a first page mode of operation. In the first page mode, if predetermined time period is expired from step-down of the row address strobe signal RAS, a column address signal is latched without step-down of the column address strobe signal CAS, and a data bit is transferred from the bit line pair indicated by the column address signal to the outside thereof. The column address strobe signal CAS is used for different purpose such as output enable or activation of a write enable. In the first page mode, the column address signal is automatically latched by the dynamic random access memory device, and any variation of the column address signal changes the designated column address, and a nibble mode or a static column mode is easily achieved in the first page mode of operation. As described hereinbefore, the CMOS inverters decrease the power consumption of the dynamic random access memory device. If the CMOS inverters are operative on an interface between a power voltage level and the ground voltage level, the standby current is of the order of 50 to 100 microamperes, and products with the lowest current consumption are sold as "low-power consumption version".

Figure 1:
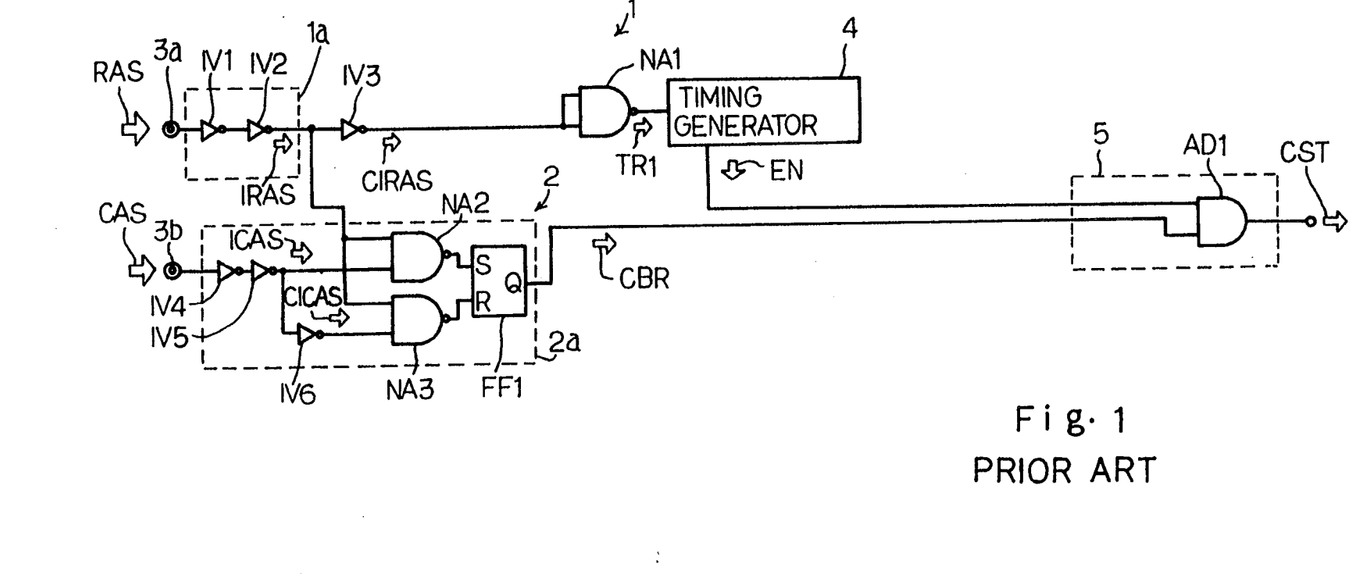
FIG. 1 is a circuit diagram showing the arrangement of a CAS-Before-RAS discriminator for the first CAS-Before-RAS autorefreshing of the prior art dynamic random access memory device.
Figure 2:
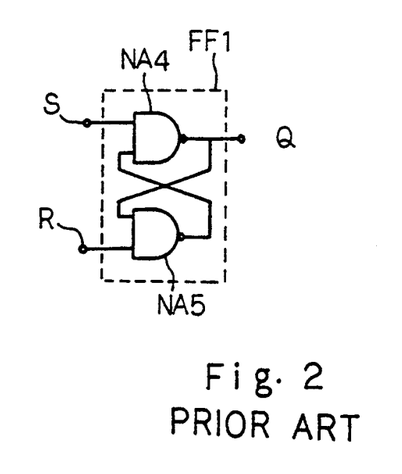
FIG. 2 is a circuit diagram showing the arrangement of the R-S flip flop circuit.

However, a problem is encountered in the low-power consumption version of the prior art dynamic random access memory device with the first page mode in testability. For better understanding, description is firstly made on two kinds of CAS-Before-RAS autorefreshing. FIG. 1 shows the circuit arrangement of a CAS-Before-RAS autorefreshing discriminator associated with circuits for data bits on bit line pairs, and the CAS-Before-RAS autorefreshing discriminator comprises two signal paths 1 and 2. The first signal path 1 is implemented by three inverters IV1, IV2 and IV3 and a NAND gate NA1 coupled in series between a first signal input terminal 3a and a timing generator 4, and is responsive to a row address strobe signal RAS applied to the first signal input terminal 3a. The inverters IV1 and IV2 form a level shifter 1a from the TTL-level to the MOS-level, and the level-shifter 1a produces an in-phase internal row address strobe signal IRAS. The internal row address strobe signal IRAS is inverted to produce the complementary signal CIRAS, and the complementary signal CIRAS is supplied to both input nodes of the NAND gate NA1. Therefore, the NAND gate NA1 serves as an inverter, and the step-down of the row address strobe signal RAS causes the NAND gate NA1 to produce a trigger signal TR1 of active low level, and the timing generator 4 is triggered with the trigger signal TR1 for producing a ready signal EN. While the ready signal EN remains in the low level, the ready signal indicates that circuits for the data bits on the bit lie pairs must stand idle. However, if the ready signal EN is stepped up, the ready signal EN is indicative of time when circuits be activated for increasing the differential voltage levels on the bit line pairs to a restore level. On the other hand, the second signal path 2 is implemented by a latch circuit 2a coupled with the second signal input terminal 3b, and the latch circuit 2a comprises three inverters IV4, IV5 and IV6, two NAND gates NA2 and NA3 and an R-S flip flop circuit FF1. The column address strobe signal CAS is supplied to the second signal input terminal 3b, and the inverters IV5 and IV6 produce an in-phase internal column address strobe signal ICAS and the complementary signal CICAS thereof. The internal row address strobe signal IRAS is supplied in parallel to the NAND gates NA2 and NA3, and, accordingly, the NAND gates NA2 and NA3 are enabled only when the row address strobe signal RAS and, accordingly, the internal row address strobe signal IRAS remain in the inactive high level. The flip flop circuit FF1 is implemented by two NAND gates NA4 and NA5 coupled as shown in FIG. 2. The NAND gates NA4 and NA5 are respectively coupled with a set node S and a reset node, R, and the output nodes of the NAND gates NA5 and NA4 are respectively coupled with the other input nodes of the NAND gates NA4 and NA5. The output node of the NAND gate NA4 serves as an output node Q. The circuit behavior of the R-S flip flop circuit FF1 is well know in the art, and no further description is incorporated hereinbelow. The output signal CBR of the latch signal 2a and the ready signal EN are supplied to an activation signal generator 5 implemented by an AND gate AD1, and the output signal CBR is ANDed with the ready signal EN for producing an activation signal CST for producing the circuits associated with the data bits on the bit line pairs. If the column address strobe signal CAS is stepped down after the row address strobe signal RAS, the internal row address strobe signal of the low level disables the NAND gates NA2 and NA3, and the latch circuit 2a maintains the output signal CBR in the high level. Then, the activation signal generator 5 produces the activation signal CST in synchronism with the ready signal EN in the standard mode of operation. The activation signal CST allows the circuits associated with data bits on the bit line pairs such as sense amplifier circuits, a column selector and a data buffer to be activated. However, if, on the other hand, the column address strobe signal CAS is stepped down before the row address strobe signal RAS, the dynamic random access memory device enters the CAS-Before-RAS autorefreshing mode. Before the step-down of the row address strobe signal RAS, the internal row address strobe signal IRAS of the high level enables the NAND gates NA2 and NA3, and the column address strobe signal CAS of the low level causes the flip flop circuit FF1 to produce the output signal CBR of the low level. The flip flop circuit FF1 maintains the output signal CBR in the low level upon the step-down of the row address strobe signal RAS, and the activation signal generator 5 never produces the activation signal CST in the CAS-Before-RAS autorefreshing mode. This means that any data bit is read out from the memory cell array. Thus, the first CAS-Before-RAS autorefreshing is featured by the absence of the activation signal CST.

Figure 3:
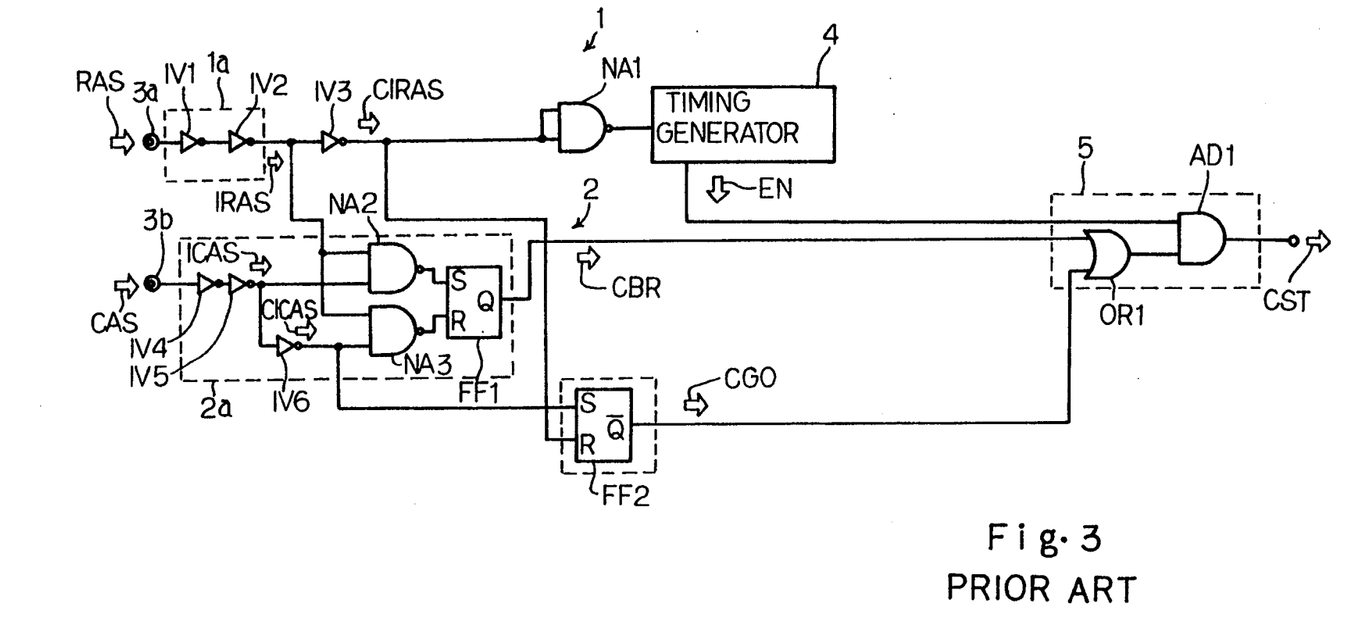
FIG. 3 is a circuit diagram showing the arrangement of another CAS-Before-RAS discriminator for the second CAS-Before-RAS autorefreshing of the prior art dynamic random access memory device.
Figure 4:
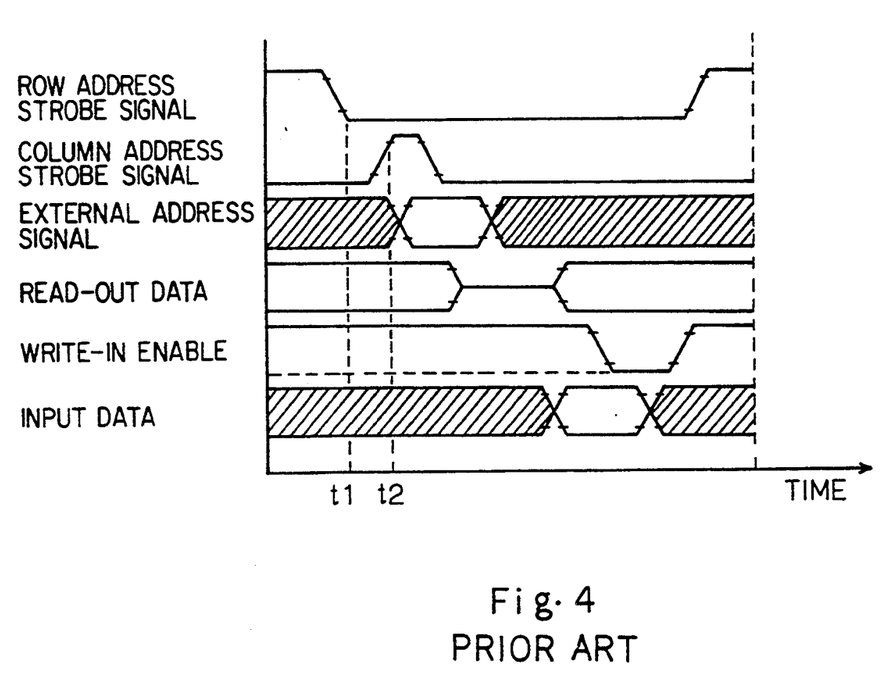
FIG. 4 is a timing chart showing the an autorefreshing sequence carried out by the prior art dynamic random access memory device with the CAS-Before-RAS discriminator shown in FIG. 3.

FIG. 3 shows another CAS-Before-RAS autorefreshing discriminator used in the second CAS-Before-RAS autorefreshing sequence, and a monitor circuit implemented by an R-S flip flop circuit FF2 and an OR gate OR1 are added to the CAS-Before-RAS autorefreshing discriminator shown in FIG. 1. The complementary signals CIRAS and CICAS are supplied to the reset node R and the set node S of the R-S flip flop circuit FF2, and the flip flop circuit FF2 monitors those complementary signals CICAS to bee whether or not the external column address strobe signal CAS is recovered to the high level. The output signal CGO of the flip flop circuit FF2 is supplied to the activation signal generator 5, and is ORed with the output signal CBR of the latch circuit 2a at the OR gate OR1. The output signal of the OR gate OR1 is supplied to the AND gate AD1 instead of the output signal CBR. In the standard mode of operation, the AND gate AD1 produces the activation signal CST in synchronism with the ready signal EN, and the circuits associated with the data bits on the bit line pairs are activated for a read-out operation or a write-in operation. If the column address strobe signal CAS is stepped down before the row address strobe signal RAS, the dynamic random access memory device enters the autorefreshing mode, and the complementary signal CICAS is firstly shifted to the high level, remaining the complementary signal CIRAS in the low level. The output signal CGO is in the low level. Even if the row address strobe signal RAS follows the column address strobe signal CAS, the flip flop FF2 does not change the output signal CGO. Therefore, the output signal of the OR gate OR1 is still in the low level, and the activation signal generator 5 keeps the signal CST inactive. However, if the column address strobe signal CAS is recovered to the high level, the complementary signal CICAS goes down to the low level, and the output signal CGO is shifted to the high level. Even if the column address strobe signal CAS is stepped down again, the flip flop circuit FF2 keeps the output signal CGO in the high level, and the activation signal generator 5 produces the activation signal CST in synchronism with the ready signal EN. Thus, the second CAS-Before-RAS autorefreshing sequence is featured by production of the activation signal CST, and component circuits associated with the data bits on the bit line pairs are activated with the activation signal CST. The second CAS-Before-RAS autorefreshing sequence is available for diagnosis of an internal address counter with the signal sequence shown in FIG. 4. If the row address strobe signal RAS is stepped down after the column address strobe signal CAS at time t1, the dynamic random access memory device enters the second CAS-Before-RAS autorefreshing mode. The column address strobe signal CAS is temporary recovered to the high level at time t2, and the activation signal generator 5 can shift the activation signal CST in synchronism with the ready signal EN. Since the address signal is fixed to address code indicative of zero, input data bits are written into the addresses sequentially incremented by the internal address counter. After the sequential write-in operation with the internal address counter, the data bits are sequentially read out from the memory cells with the external address signal, and the read-out data bits are compared with the input data bits to see whether or not any discrepancy takes place. If all of the read-out data bits are in consistent with the input data bits, the internal address counter is excellent. However, if any discrepancy takes place, the internal address counter may be defective.

Comparing the first CAS-Before-RAS autorefreshing sequence with the second CAS-Before-RAS autorefreshing sequence, the first CAS-Before-RAS autorefreshing sequence is advantageous in current consumption, because the component circuits associated with the data bits on the bit line pairs are kept inactive. In detail, according to a standard design specification, a dynamic random access memory device is usually designed to repeat the first CAS-Before-RAS autorefreshing sequence at every 60 microseconds, and the row address strobe signal RAS is activated during cycle time period tras of about 1 microsecond. Assuming now that ICC1, tRAS, tCYC and ICC2 are respectively indicative of the average current, the cycle time of the external row address strobe signal, the pulse width of the row address strobe signal and the amount of standby current in the minimum cycle, dc current consumption ICCA after activation of the activation of the row address strobe signal RAS takes two values depending upon the row address strobe signal RAS. While the row address strobe signal RAS remains in zero or low level in the CAS-Before-RAS autorefreshing cycle, the dc current consumption ICCA takes the first value ICCL. On the other hand, after the row address strobe signal RAS is lifted to the high level in the CAS-Before-RAS autorefreshing cycle, the dc current consumption ICCA takes the second value ICCH. In case of a CMOS implementation of 1 megabit dynamic random access memory device for access time of 80 nanoseconds, the time period tRAS is about 80 nanoseconds, the pulse width tCYC is about 160 nanoseconds, the average current consumption of the minimum cycle ICC1 is about 75 milliamperes, the average current consumption in idle state or waiting state ICC2 is about 60 microamperes, and the dc current consumption takes the first value ICCL of 2 milliamperes and the second value ICCH of about 12 milliamperes. If the CMOS implementation executes the first CAS-Before-RAS autorefreshing sequence, the dc current consumption ICCA is constant regardless of the row address strobe signal RAS, i.e., both first and second values are about 2 milliamperes. Current consumption in the CAS-Before-RAS autorefresh cycle Icc is expressed as $$Icc = (tCYC \times ICC1 + (tras - tRAS) \times ICCA + (tcyc - tras - tCYC + tRAS) \times ICC2C/tcyc \quad \text{Equation 1}$$

The first term of Equation 1 is indicative of ac current, and is equal to ICC1 in the second CAS-Before-RAS autorefreshing sequence. However, since the circuits associated with the data bits on the bit line pairs are not activated in the first CAS-Before-RAS autorefreshing sequence, the ac current consumption is two third of the second CAS-Before-RAS autorefreshing sequence. The second term of Equation is indicative of dc current while the row address strobe signal RAS remains in the low or zero level, and the ICCA in the first CAS-Before-RAS autorefreshing sequence is equal to ICCL; however, the ICCA in the second CAS-Before-RAS autorefreshing sequence is equal to ICCH. For this reason, if tcyc and tras are respectively equal to 60 microseconds and 1 microsecond, the current consumption Icc for the first CAS-Before-RAS autorefreshing sequence is given as $$\begin{aligned}
Icc &= (0.16 \times 75 \times 2/3 + (1 - 0.08) \times 2 + \\
&\quad (60 - 1 - 0.16 + 0.08) \times 0.06)/60 \\
&= (8 + 1.96 + 3.535)/60 = 0.255 \text{ mA}
\end{aligned} \quad \text{Equation 2}$$

However, the current consumption Icc for the second CAS-Before-RAS autorefreshing sequence is given as $$\begin{aligned}
Icc &= (0.16 \times 75 + (1 - 0.08) \times 12 + \\
&\quad (60 - 1 - 0.16 + 0.08) \times 0.06)/60 \\
&= (12 + 11.04 + 3.535)/60 = 0.443 \text{ mA}
\end{aligned} \quad \text{Equation 3}$$

Comparing Equation 3 with Equation 2, it is understood that the current consumption Icc of the second CAS-Before-RAS autorefreshing sequence is twice as large as that of the first CAS-Before-RAS autorefreshing sequence.

As described hereinbefore, the second CAS-Before-RAS autorefreshing sequence is advantageous in testability over the first CAS-Before-RAS autorefreshing sequence, and there is a trade-off between the current consumption Icc in the autorefreshing cycle and the testability. In fact, the diagnosis of the internal address counter is completed within several milliseconds for the second CAS-Before-RAS autorefreshing sequence. However, diagnosis for the first CAS-Before-RAS autorefreshing sequence consumes 3 to 4 seconds in high temperature ambience and 100 to 130 seconds in room temperature, because it is necessary to see whether or not the first CAS-Before-RAS autorefreshing sequence repeatedly carried out over certain time period destroying most of data bits without refresh allows the memory cells to maintain the data bits. Moreover, the diagnosis for the first CAS-Before-RAS autorefreshing sequence be carried out under the different power conditions.

Thus, designers have only choice between the first and second CAS-Before-RAS autorefreshing sequence.

SUMMARY OF THE INVENTION

It is therefore an important object of the present invention to provide a dynamic random access memory device which is improved in testability without sacrifice of current consumption.

To accomplish the object, the present invention proposes to produce an activation signal in both standard and diagnostic modes of operation for establishing a data path between bit line pairs and the outside thereof; however, any activation signal is not produced in an autorefreshing mode.

In accordance with the present invention, there is provided a dynamic random access memory device, having a standard mode, an autorefreshing mode and a diagnostic mode of operation, comprising: a) a memory cell array having a plurality of memory cells arranged in rows and columns and respectively storing data bits in the form of electric charges; b) a plurality of bit line pairs respectively associated with the columns of the memory cell array, and propagating data bits in the form of differential voltage level; c) a plurality of word lines respectively associated with the rows of the memory cell array, and allowing the rows to be selectively coupled with the plurality of bit line pairs, respectively; d) a first peripheral circuit group provided in association with the word lines for selectively driving the plurality of word lines on the basis of an external row address signal in the standard mode and of an internal row address signal in the autorefreshing and diagnostic modes; e) a second peripheral circuit group coupled with the plurality of bit line pairs for developing the data bits to a restore level in the autorefreshing mode; f) a third peripheral circuit group coupled between the plurality of bit line pairs and a data terminal, and activated in the standard and diagnostic modes with an activation signal for transferring a data bit between the data terminal and one of the plurality of bit line pairs, the third peripheral circuit group containing the second peripheral circuit group; and g) a self-refresh controller responsive to a plurality of external control signals for producing the activation signal, the plurality of external control signals being controlled in a first sequence in the standard mode, in a second sequence in the autorefreshing mode and in a third sequence in the diagnostic mode.

The plurality of external control signals may be a row address strobe signal and a column address strobe signal, or a row address strobe signal, a column address strobe signal and a write enable signal.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 5:
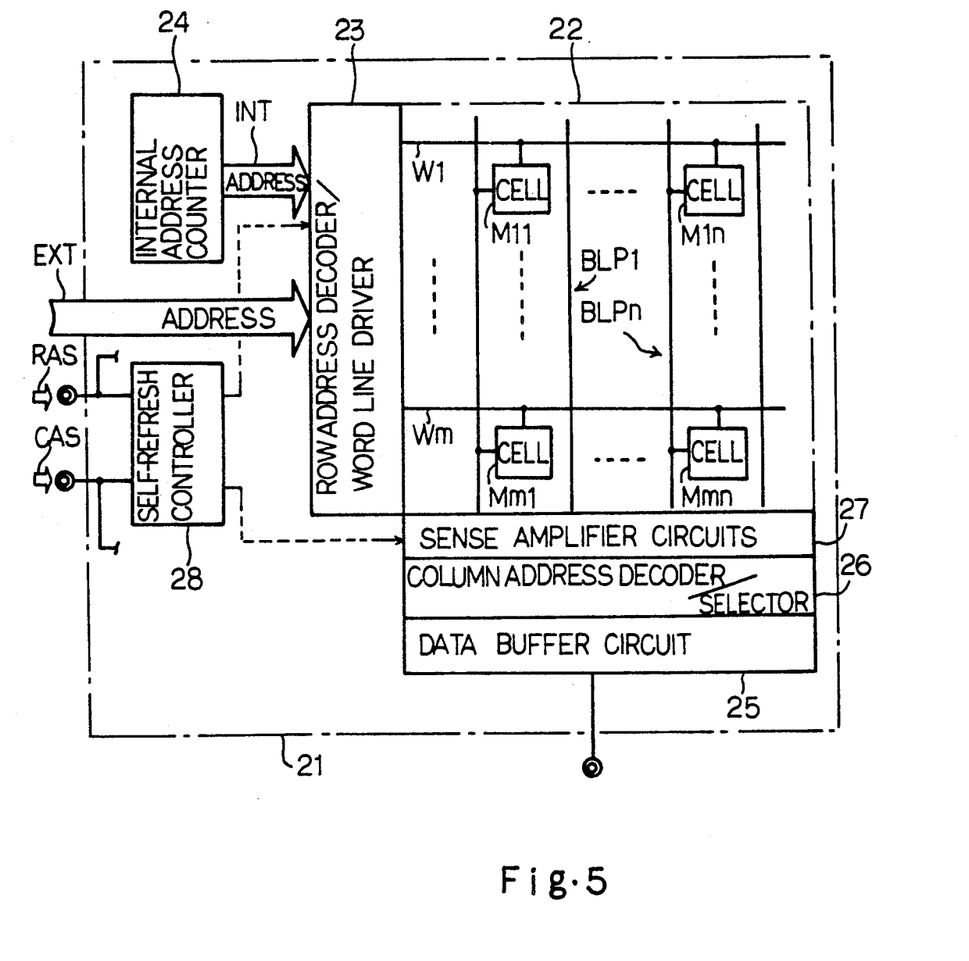
FIG. 5 is a block diagram showing the circuit arrangement of a dynamic random access memory device according to the present invention.

Referring to FIG. 5 of the drawings, a dynamic random access memory device embodying the present invention is fabricated on a single semiconductor chip 21, and comprises a memory cell array 22 having memory cells M11, M1n, Mm1 and Mmn arranged in rows and columns, and each of the memory cells M11 to Mmn is implemented by a series combination of an n-channel enhancement type transfer transistor and a storage capacitor. The dynamic random access memory device shown in FIG. 5 selectively enters a diagnostic mode, a self-refresh mode and a standard mode of operation, and the standard mode of operation has a write-in phase and a read-out phase.

A plurality of word lines W1 to Wm are respectively associated with the rows of the memory cell array 22, and each of the word lines W1 to Wm is coupled with the gate electrodes of the n-channel enhancement type transfer transistors. A plurality of bit line pairs BLP1 to BLPn are provided in association with the columns of the memory cell array 22, and one of the component bit lines of each bit line pair BLP1 or BLPn is coupled with the drain nodes of the n-channel enhancement type transfer transistors. Row address decoder and word line driver 23 is associated with the word lines W1 to Wm, and either external or internal row address signal EXT or INT is supplied to the row address decoder/ word line driver 23 depending upon the mode of operation. The row address decoder/ word line driver 23 serves as a first peripheral circuit group. The external row address signal EXT is supplied from the outside thereof, and the internal row address signal INT is produced by an internal address counter 24. With either external or internal row address signal EXT or INT, the row address decoder/ word line driver 23 selectively drives the word lines W1 to Wm to an active high voltage level, and data bits are read out from the row of memory cells coupled therewith to the associated bit line pairs in the read-out phase, thereby producing differential voltage levels on the respective bit line pairs BLP1 to BLPn. A differential voltage level indicative of a write-in data bit is supplied from a data buffer circuit 25 through a column selector associated with a column address decoder 26 to one of the bit line pairs BLP1 to BLPn in the write-in phase. The bit line pairs BLP1 to BLPn propagate the differential voltage level or levels to sense amplifier circuits 27, and the sense amplifier circuits 27 develop the differential voltage level or levels on the associated bit line pair or pairs. One of the differential voltage levels thus developed is transferred through the column address decoder/ selector 26 to the data buffer circuit 25 in the read-out phase, and the differential voltage level indicative of the write-in data bit is stored in one of the memory cells coupled with the activated word line. In this instance, the sense amplifier circuits 27 serve as a second peripheral circuit group, and the sense amplifier circuits 27, the column address decoder/ selector 26 and the data buffer circuit 25 form in combination a third peripheral circuit group.

The internal address counter 24 is associated with a self-refresh controller 28, and the self-refresh controller 28 discriminates an instruction for a CAS-Before-RAS autorefreshing. Upon discrimination of the instruction, the self-refresh controller 28 allows the dynamic random access memory device to enter the self-refresh mode of operation, and causes the row address decoder/ word line driver 23 to be responsive to the internal row address signal INT. Upon activation, the row address decoder/ word line driver 23 decodes the internal address signal INT, and sequentially drives the word lines W1 to Wm to the active high voltage level. The sense amplifier circuits 27 develop differential voltage levels on the respective bit line pairs BLP1 to BLPn to a predetermined restore level, and the data bits thus refreshed are restored in the memory cells M11 to Mmn again.

Figure 6:
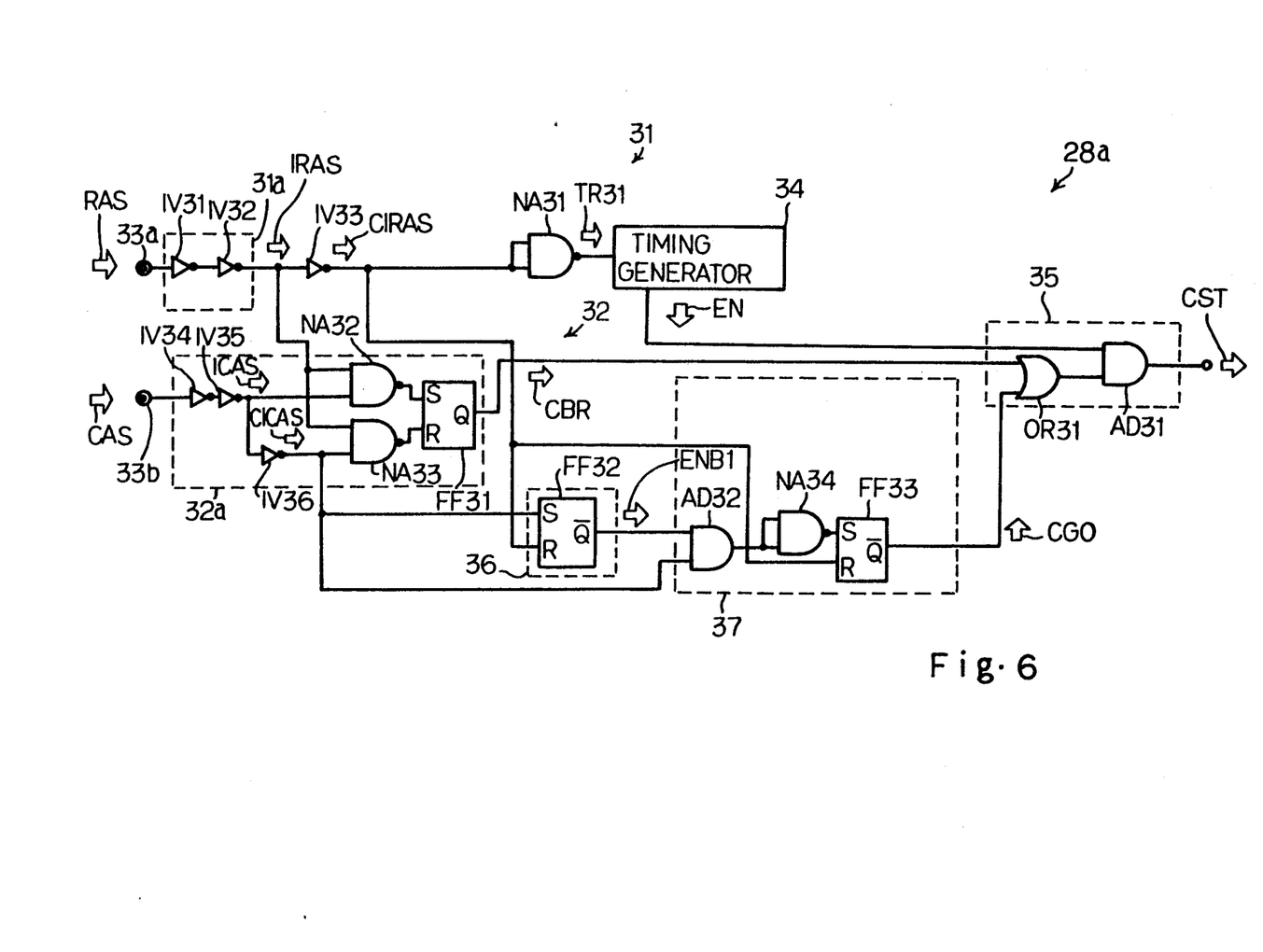
FIG. 6 is a circuit diagram showing the arrangement of a circuitry for discriminating an instruction of mode and incorporated in the dynamic random access memory device according to the present invention.

The self-refresh controller 28 has a circuitry 28a for discriminating the instruction, and the circuitry 28a is shown in FIG. 6 in detail. The circuitry 28a is responsive to an external row address strobe signal RAS and an external column address strobe signal CAS, and produces an activation signal CST for a peripheral circuit group associated with data bits on the bit line pairs BLP1 to BLPn in the standard mode and the diagnostic mode of operation. The peripheral circuit group contains at least the sense amplifier circuits 27, the column address decoder/ selector 26 and the data buffer circuit 25. However, another peripheral circuit group incorporated in the dynamic random access memory device may further contain a transfer gate unit and/or a pull-up circuit group.

The circuitry 28a shown in FIG. 6 is an improvement on the basis of the prior art CAS-Before-RAS discriminator shown in FIG. 3, and, accordingly, comprises two signal paths 31 and 32 respectively assigned to the external row address strobe signal RAS and the external column address strobe signal CAS. The first signal path 31 is implemented by three inverters IV31, IV32 and IV33 and a NAND gate NA31 coupled in series between a first signal input terminal 33a and a timing generator 34. The inverters IV31 and IV32 form a level shifter 31a from the TTL-level to the MOS-level, and the level-shifter 31a produces an in-phase internal row address strobe signal IRAS. The internal row address strobe signal IRAS is inverted to produce the complementary signal CIRAS, and the complementary signal CIRAS is supplied to both input nodes of the NAND gate NA31. Therefore, the NAND gate NA31 serves as an inverter, and the step-down of the row address strobe signal RAS causes the NAND gate NA31 to produce a trigger signal TR31 of an active low level, and the timing generator 34 is triggered with the trigger signal TR31 for producing a ready signal EN. While the ready signal EN remains in the low level, the ready signal indicates that the peripheral circuit group for the data bits on the bit lie pairs BLP 1 to BLPn must stand idle. However, if the ready signal EN is stepped up, the ready signal EN is indicative of time when the peripheral circuit group be activated for developing the differential voltage levels on the bit line pairs to a restore level. On the other hand, the second signal path 32 is implemented by a latch circuit 32a coupled with the second signal input terminal 33b, and the latch circuit 32a comprises three inverters IV34, IV35 and IV36, two NAND gates NA32 and NA33 and an R-S flip flop circuit FF31. The column address strobe signal CAS is supplied to the second signal input terminal 33b, and the inverters IV35 and IV36 respectively produce an in-phase internal column address strobe signal ICAS and the complementary signal CICAS thereof. The internal row address strobe signal IRAS is supplied in parallel to the NAND gates NA2 and NA3, and, accordingly, the NAND gates NA32 and NA33 are enabled only when the row address strobe signal RAS and, accordingly, the internal row address strobe signal IRAS remain in the inactive high level. The flip flop circuit FF31 is similar in circuit arrangement to the R-S flip flop circuit FF1 shown in FIG. 2. The NAND gates NA34 and NA35 are respectively coupled with a set-node S and a reset node R of the flip flop circuit FF31, and a first enable signal CBR of the latch circuit 32a and the ready signal EN are supplied to an activation signal generator 35 implemented by combination of an OR gate OR31 an AND gate AD31. The activation signal CST is produced by the activation signal generator 35, and is used for activation of the peripheral circuit group. The circuitry 28a further comprises a first monitor circuit 36 implemented by a flip flop circuit FF32, and a second monitor circuit 37. The complementary signals CIRAS and CICAS are respectively supplied to the reset node R and the set node S of the flip flop circuit FF32, and the first monitor circuit 36 monitors the complementary signal CICAS to see whether or not the external column address strobe signal CAS is recovered from the active low level to the inactive high level. Namely, when the external row address strobe signal RAS is stepped down, the complementary signal CIRAS of the high level is supplied to the reset node R of the flip flop circuit FF32, but can not reset the flip flop circuit FF32, because the complementary signal CICAS still remains in the high level. However, if the external column address signal CAS is recovered to the high level again, the complementary signal CICAS goes down to the low level, and the complementary signal CIRAS previously stepped-up rests the flip flop circuit FF32. Thus, the first monitor circuit 36 detects the recovery of the external column address strobe signal CAS after the entrance of the CAS-Before-RAS autorefreshing. The second monitor circuit 37 comprises an AND gate AD32, a NAND gate NA34 and a flip flop circuit FF33, and monitors the complementary signal CICAS to see whether or not the external column address strobe signal CAS is stepped down again after the recovery. Namely, a third enable signal ENB1 of the flip flop circuit FF32 and the complementary signal CICAS are supplied to the input nodes of the AND gate AD32, respectively, and the output node of the AND gate AD32 is coupled with both input nodes of the NAND gate NA34. The complementary signal CIRAS and the output signal of the NAND gate NA34 are respectively supplied to the reset node R and the set node S of the flip flop circuit FF33, and the output node of the flip flop circuit FF33 is supplied to the OR gate OR31 together with the first enable signal CBR of the latch circuit 32a. Since the flip flop circuit FF32 shifts the third enable signal ENB1 upon the step-up of the external column address strobe signal CAS in the CAS-Before-RAS autorefreshing mode as described hereinbefore, the AND gate AD32 is enabled after the step-up of the external column address strobe signal CAS, and shifts the output signal to the high level when the external column address strobe signal CAS is stepped down again. Since the output signal of the AND gate AD32 is supplied to both input nodes of the NAND gate NA34, the NAND gate NA34 serves as an inverter, and shifts the output signal to the low level. The reset node R of the flip flop circuit FF33 has been stepped up as similar to the flip flop circuit FF32, and the output signal of the NAND gate NA34 allows the flip flop circuit FF33 to shift a second enable signal CGO hereof to the high level. Therefore, the second monitor circuit 37 detects the step-down of the external column address strobe signal CAS after the entry of the CAS-Before-RAS autorefreshing mode.

If the column address strobe signal CAS is stepped down after the row address strobe signal RAS, those strobe signals CAS and RAS are indicative of the standard mode, and the behavior of the circuitry 28a is similar to that of the CAS-Before-RAS discriminator shown in FIG. 3. No further description is incorporated hereinbelow for avoiding repetition. However, if, on the other hand, the column address strobe signal CAS is stepped down before the row address strobe signal RAS, the dynamic random access memory device enters the CAS-Before-RAS autorefreshing mode. However, the activation signal CST is never produced in so far as the external column address strobe signal CAS is shifted from the low level through the high level to the low level. This results in that the peripheral circuit group except for component circuits such as, for example, the sense amplifier circuits 27 is never activated, and the current consumption is decreased in comparison with the prior art second CAS-Before-RAS autorefreshing sequence.

If the column address strobe signal CAS is shifted from the low level through the high level to the low level, the dynamic random access memory device enters the diagnostic mode of operation. Before the step-down of the row address strobe signal RAS, the internal row address strobe signal IRAS of the high level enables the NAND gates NA32 and NA33, and the column address strobe signal CAS of the low level causes the flip flop circuit FF31 to produce the first enable signal CBR of the low level. The flip flop circuit FF1 maintains the first enable signal CBR in the low level after the step-down of the row address strobe signal RAS, because the NAND gates NA32 and NA33 are disabled. Thus, the first enable signal CBR is kept in the low level in the CAS-Before-RAS autorefreshing mode. However, If the external column address strobe signal CAS is stepped up and, thereafter, stepped down again, the first monitor circuit 36 enables the AND gate AD32 upon the step-up of the external column address strobe signal CAS as described above, and the second monitor circuit 37 shifts the second enable signal CGO upon the second step-down of the external column address strobe signal CAS. With the second enable signal CGO, the activation signal generator 35 produces the activation signal CST in synchronism with the ready signal EN, and the circuitry 28a allows checking the internal address counter 24 in the diagnostic mode of operation as similar to the prior art CAS-Before-RAS discriminator shown in FIG. 3.

As described hereinbefore, the activation signal generator 35 never produces the activation signal CST in the CAS-Before-RAS autorefreshing mode, because the column address strobe signal CAS is never shifted from the low level through the high level to the low level in the CAS-Before-RAS autorefreshing mode. In general, a plurality of dynamic random access memory devices are coupled in a wired-OR fashion in an electronic system, and the self-refreshing is usually carried out for all of the dynamic random access memory devices or at least dynamic random access memory devices on the same circuit board. In this situation, if the column address strobe signal CAS is controlled as in the diagnostic mode, data bits are collision with one another, and a large amount of current flows in the electronic system. In order to prohibit the electronic system from the aforesaid problems, the column address strobe signal CAS is never shifted from the low level through the high level to the low level in both standard and autorefreshing modes of operation.

As will be understood from the foregoing description, the dynamic random access memory device implementing the first embodiment can diagnose the internal address counter 24 in the diagnostic mode, and decreases current consumption in the CAS-Before-RAS autorefreshing mode. In fact, the circuitry 28a can decrease the average current ICC1 in the first term of Equation 1 to two third, and the dc current consumption ICCA takes the lower value ICCL. The current consumption of the first embodiment becomes as small as that of the first prior art CAS-Before-RAS autorefreshing sequence. Therefore, the dynamic random access memory device can be improved in current consumption without sacrifice of testability.

Second Embodiment

Figure 7:
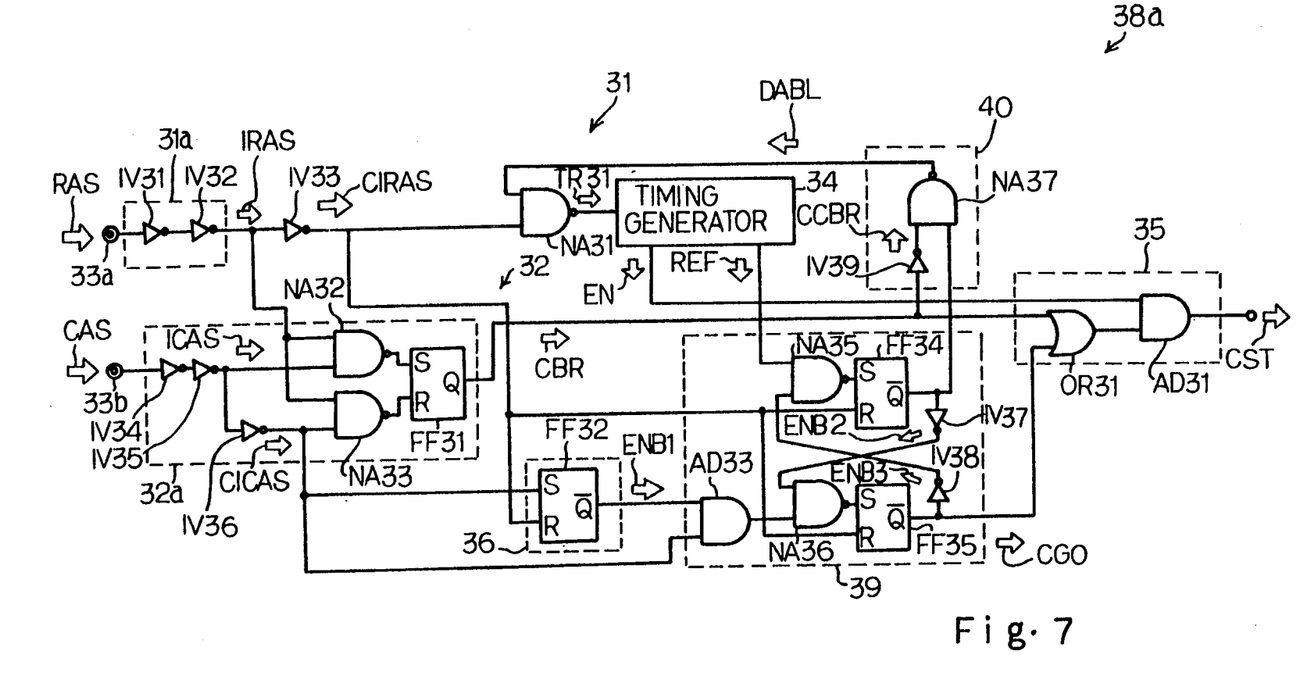
FIG. 7 is a circuit diagram showing the arrangement of a circuitry for discriminating an instruction of mode and incorporated in another dynamic random access memory device according to the present invention.

Turning to FIG. 7 of the drawings, another circuitry 38a forming a part of a self-refresh controller is incorporated in another dynamic random access memory device embodying the present invention. The circuitry 38a is corresponding to the circuitry 28a, and corresponding circuit components are labeled with the same references used in FIG. 6. In general, if a refreshing cycle is interrupted before completion, data bits read out from memory cells are destroyed. In order to prevent from the data bits from destruction, an prohibiting signal is produced until completion of the refresh cycle, and the activation signal CST is never recovered to the inactive level in the presence of the prohibiting signal. The dynamic random access memory device implementing the second embodiment is assumed to produce the prohibiting signal.

The second monitor circuit 39 of the circuitry 38a comprises an AND gate AD33, two NAND gates NA35 and NA36, two flip flop circuits FF34 and FF35 and two inverters IV37 and IV38. The AND gate AD33 is enabled with the third enable signal ENB1, and the NAND gates NA35 and NA36 are enabled with the complementary signals of the output signals of the flip flop circuits FF35 and FF34, respectively. The inverting circuits IV37 and IV38 complementarily produce fourth and fifth enable signals ENB2 and ENB3, and the fourth and fifth enable signals ENB2 and ENB3 are respectively supplied to the NAND gates NA35 and NA36. For this reason, either NAND gate NA35 or NA36 is enabled with the associated enable signal ENB2 or ENB3, and the second enable signal CGO is produced by the combination of the AND gate AD33, the NAND gate NA36 and the flip flop circuit FF35 as similar to the first embodiment. The NAND gate NA35 is further supplied with a completion signal REF from the timing generator 34, and the completion signal REF is indicative of completion of a self-refreshing cycle, i.e., restoring of refreshed data bits. Namely, while data bits on the bit line pairs BLP1 to BLPn are destructible, the completion signal REF remains in the low level, and is shifted to the high level upon completion of the self-refresh cycle. The output signal of the NAND gate NA35 and the complementary signal CIRAS are respectively supplied to the set node S and the reset node R of the flip flop circuit FF34.

The circuitry 38a further comprises a prohibiting circuit 40 for disabling the timing generator 34, and the prohibiting circuit 40 is implemented by combination of an inverter IV39 and a NAND gate NA37. The inverter IV39 is responsive to the first enable signal CBR, and produces the complementary signal CCBR thereof. The output signal of the flip flop circuit FF34 and the complementary signal CCBR are supplied to the input nodes of the NAND gate NA37, and a disable signal DABL is supplied from the NAND gate NA37 to the NAND gate NA31.

The circuitry 38a discriminates an instruction of mode on the basis of control sequence on the external row and column address strobe signals RAS and CAS. While both external row and column address strobe signals RAS and CAS remain in the inactive high level, the complementary signal CIRAS of the low level causes the flip flop circuit FF34 to produce the output signal of the low level, and the NAND gate NA37 shifts the disable signal DABL to the inactive high level in the presence of the complementary signal CCBR of the high level. Then, the NAND gate NA31 is enabled, and allows the timing generator 34 to be activated upon step-down of the external row address strobe signal RAS. In the standard mode, the first enable signal CBR of the high level causes the NAND gate NA6 to maintain the output node thereof in the high level, and the timing generator 34 is noticed to complete the read-out or write-in phase upon the step-up of the external row address strobe signal RAS. The activation signal CST is produced in synchronism with the ready signal EN.

If the external column address strobe signal CAS is stepped down before the external row address strobe signal RAS, the dynamic random access memory device assumes to start the CAS-Before-RAS autorefreshing mode. The NAND gate NA37 allows the timing generator 34 to be triggered by the NAND gate NA31 upon the step-down of the external row address strobe signal RAS, and the timing generator 34 can produce the ready signal EN as well as the completion signal REF. Upon the step-down of the external row address strobe signal RAS after the column address strobe signal CAS, both of the third enable signal ENB1 and the completion signal REF are in the low level, and both flip flop circuits FF34 and FF35 cause the respective output nodes to remain low. Moreover, the first enable signal CBR is in the low level, and the complementary signal CCBR of the high level enables the NAND gate NA37 to as to serve as an inverter.

If the external column address strobe signal CAS does not swing between the high and low levels after the step-down of the external column address strobe signal CAS, the dynamic random access memory device surely entered in the CAS-Before-RAS autorefreshing mode, and the completion signal REF of the high level is produced after completion of the self-refresh cycle. Then, the NAND gate NA35 causes the flip flop circuti FF34 to shift the output signal thereof from the low level to the high level, and the NAND gate NA37 cause the disable signal DABL to go down to the active low level. With the disable signal DABL of the active low level, the NAND gate NA31 informs the timing generator 34 of the completion of the self-refreshing cycle. The output signal of the flip flop circuit FF34 is inverted by the inverter IV37, and the complementary signal of the low level disables the NAND gate NA36 so that the second enable sigal CGO is never produced.

If, on the other hand, the external column address strobe signal CAS is shifted from the low levle through the high level to the low level, the dynamic random access memory device enters the diagnostic mode, and the first monitor circuit 36 supplies the third enable signal ENB1 to the AND gate AD33 earlier than the completion siganl REF. Then, the NAND gate NA36 causes the flip flop circuit 39 to shift the second enable signal CGO to the active high level, and the activation siganl generator 35 supplies the activation siganl CST to the peripheral circuit group between the bit line pairs BLP1 to BLPn and the data terminal. The second enable signal CGO of th ehigh level is inverted to the fifth enable signal of the inactive low level, and, accordingly, the NAND gate NA35 is disabled.

In general, a self-refresh cycle is completed on all of the memory cells coupled with an activated word line until the mid point of the mininum pulse with of the external row address strobe signal RAS, and, for this reason, the dynamic random access memory device implementing the second embodiemnt is established in the diagnostic mode of operation in so far as the external column address strobe signal CAS is shifted from the low levle through the high level to the low level before the mid point.

The circuitry 38a is advantageous in view of further reduction in current consumption. In general, the duration of the self-refresh cycle is defined by the cycle time period tras which in turn is defined by the pulse width of the ready signal EN. Since the timing generator 34 recovers the ready signal EN to the inactive low level upon completion of the self-refresh cycle, and the duration of the self-refresh cycle is approximately equal to the minimum pulse width of the external row address strobe siganl RAS or shorter than the minimum pulse width. The circuitry 38a decreases current consumption Icc at about 15 per cent rather than the circuitry 28a. In fact, the dc current consumption ICCA is equal to the amount of standby current ICC2C, and the second term of Equation 1 is approximatery zero by using the circuitry 38a. The current consumption Icc of the second embodiemnt is given as $$Icc = (0.16 \times 75 \times 2/3 + (0.08 - 0.08) \times 2 + \\ (60 - 0.08 - 0.16 + 0.08) \times 0.06)/60 \\ = 0.193 \text{ mA}$$

Equation 4

In the second embodiemnt, the completion signal REF is produced upon completion of the self-refresh cycle. However, the duration for the completion signal REF may be prolonged as twice as long as that of the second embodiemnt in view of excellent test on the internal address counter, and the current consumption Icc is only slightly increased.

Third Embodiment

Figure 8:
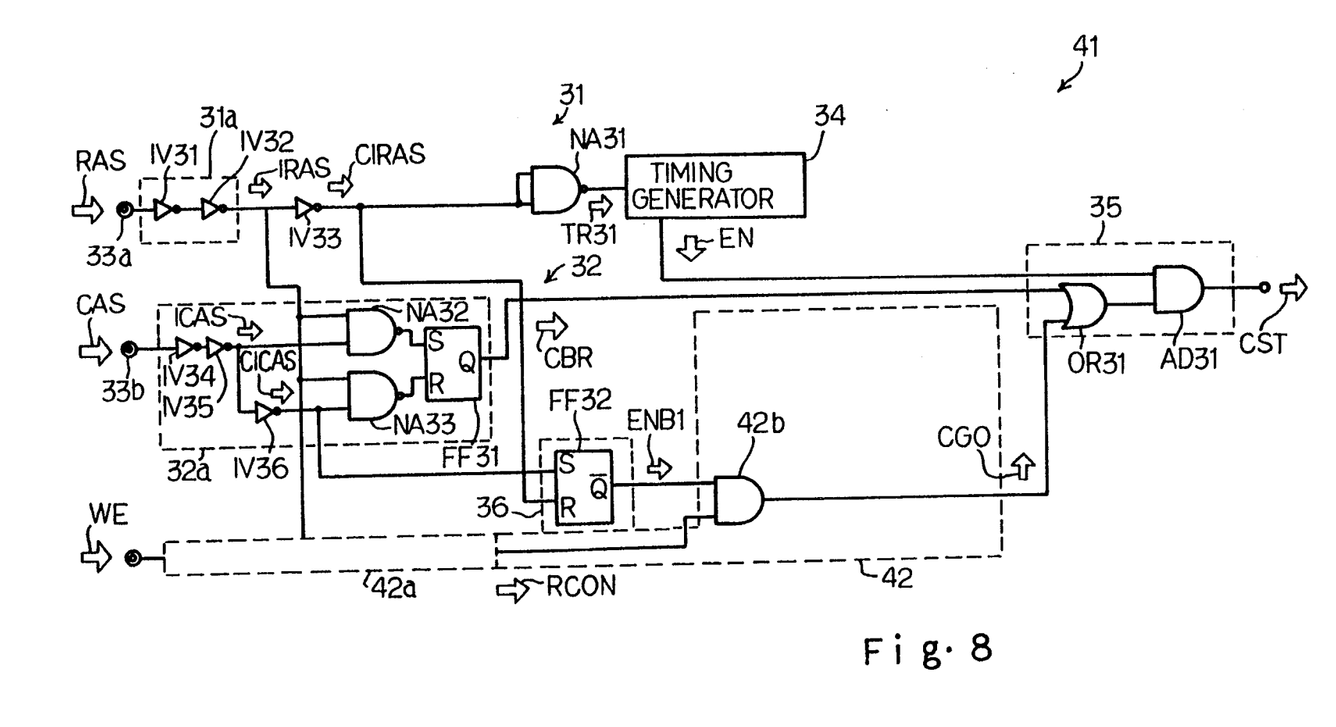
FIG. 8 is a circuit diagram showing the arrangement of a circuitry for discriminating an instruction of mode and incorporated in yet another dynamic random access memory device according to the present invention.

Turning to FIG. 8 of the drawings, a circuitry 41 incorporated in yet another dynamic random access memory device is illustrated, and is corresponding to the circuitry 28a. The circuitry 41 is responsive to three external control signals, i.e., an external row address strobe signal RAS, an external column address strobe signal CAS and a write enable signal WE, and the second monitor circuit 42 is different from the second monitor circuit 28a. However, the other circuits are similar to those of the first embodiment, and are labeled with the same references without detailed description for the sake of simplicity.

The dynamic random access memory device implementing the third embodiment selectively enters the standard mode, CAS-Before-RAS autorefreshing mode and the diagnostic mode depending upon sequence of the three external control signals RAS, CAS and WE. Namely, if the external column address strobe signal CAS is stepped down after the external row address strobe signal RAS, the dynamic random access memory device enters the standard mode. When the external column address strobe signal CAS is stepped down before the row address strobe signal RAS without any step-down of the write enable signal WE, the dynamic random access memory device is established in the diagnostic mode. However, if the write enable signal WE is stepped down, the dynamic random access memory device enters the CAS-Before-RAS autorefreshing mode.

The second monitor circuit 42 does not monitor the external column address strobe signal CAS, but monitors a write enable signal WE. The second monitor circuit 42 comprises a latch circuit 42a similar in circuit arrangement to the latch circuit 32a, ad an AND gate 42b. Therefore, the latch circuit 42a latches the write enable signal WE at the step-down of the external row address strobe signal RAS. If the write enable signal WE remains in the high level, the latch circuit 42a produces an output signal RCON of low level, and the AND gate 42b never produces the second enable signal CGO. Therefore, the dynamic random access memory device enters the CAS-Before-RAS autorefreshing mode without producing the activation signal CST. If, on the other hand, the write enable signal WE is in the low level at the step-down of the external row address strobe signal RAS, the latch circuit 42a shifts the output signal RCON to the high level, and the AND gate 42b produces the second enable signal CGO. This results in the production of the activation signal CST, and the internal address counter is tested as similar to the second CAS-Before-RAS autorefreshing sequence.

The dynamic random access memory device can also decrease the current consumption without testability. The sequence of the external control signals may be similar to that of the first and second embodiments. One of the external control signals may be replaced with another external signal such as, one of the external address bits. The output signal RCON may be produced upon step-up of one of the three external signals over a power voltage regardless of the external row address strobe signal RAS.

Although particular embodiments of the present invention have been shown and described, it will be obvious to those skilled in the art that various changes and modifications may be made without departing from the spirit and scope of the present invention. For example, general circuit arrangement of a dynamic random access memory device may be different from that shown in FIG. 5. For example, parallel data bits may be written into and read out from the memory cell array, and a flush write data buffer is, by way of example, provided in association with the bit line pairs.

What is claimed is:

1. A dynamic random access memory device, having a standard mode, an autorefreshing mode and a diagnostic mode of operation, comprising:
   a) a memory cell array having a plurality of memory cells arranged in rows and columns and respectively storing data bits in the form of electric charges;
   b) a plurality of bit line pairs respectively associated with the columns of said memory cell array, and propagating data bits in the form of differential voltage level;
   c) a plurality of word lines respectively associated with the rows of said memory cell array, and allowing said rows to be selectively coupled with said plurality of bit line pairs, respectively;
   d) a first peripheral circuit group provided in association with said word lines for selectively driving said plurality of word lines on the basis of an external row address signal in said standard mode and of an internal row address signal in said autorefreshing and diagnostic modes;
   e) a second peripheral circuit group coupled with said plurality of bit line pairs for developing said data bits to a restore level in said autorefreshing mode;
   f) a third peripheral circuit group coupled between said plurality of bit line pair and a data terminal, and activated in said standard and diagnostic modes with an activation signal for transferring a data bit between said data terminal and one of said plurality of bit line pairs, said third peripheral circuit group containing said second peripheral circuit group; and
   g) a self-refresh controller responsive to a plurality of external control signals for producing said activation signal, said plurality of external control signals being controlled in a first sequence in said standard mode, in a second sequence in said autorefreshing mode and in a third sequence in said diagnostic mode.

2. A dynamic random access memory device as set forth in claim 1, in which said plurality of external control signals are an external row address strobe signal and an external column address strobe signal, and in which said external column address strobe signal is shifted to an active level after said external row address strobe signal is shifted to an active level in said first sequence, said external column address strobe signal is shifted to the active level before said external row address strobe signal is shifted to the active level in said first sequence, and said external column address strobe signal is shifted from the active level through an inactive level to said active level after said second sequence in said third sequence.

3. A dynamic random access memory device as set forth in claim 2, in which said self-refresh controller comprises g-1) a first signal path coupled with a first input terminal assigned to said external row address strobe signal for producing an internal row address strobe signal, a first complementary signal of said internal row address strobe signal and a trigger signal, g-2) a timing generator responsive to said trigger signal, and counting a predetermined time period for producing a ready signal when said predetermined time period is expired, g-3) a latch circuit coupled with a second input terminal assigned to said external column address strobe signal for producing an internal column address strobe signal, a second complementary signal of said internal column address strobe signal, and producing a first enable signal on the basis of said first and second complementary signals and said internal column address strobe signal in said standard mode of operation, g-4) a first monitor circuit responsive to said first and second complementary signals, and producing a third enable signal when said external column address strobe signal is shifted from said active level to said inactive level in said third sequence, g-5) a second monitor circuit enabled with said third enable signal, and responsive to said first and second complementary signals for producing said second enable signal when said external column address strobe signal is shifted from said inactive level to said active level in said third sequence, and g-6) an activation signal generator enabled with one of said first and second enable signals, and responsive to said ready signal for producing said activation signal.

4. A dynamic random access memory device as set forth in claim 2, in which said self-refresh controller comprises g-1) a first signal path coupled with a first input terminal assigned to said external row address strobe signal for producing an internal row address strobe signal, a first complementary signal of said internal row address strobe signal, a trigger signal and an interrupt signal, g-2) a timing generator responsive to said trigger signal for producing a ready signal indicative of time for activation of said third peripheral circuit group and to said interrupt signal for removing said ready signal, said timing generator being further operative to produce a completion signal indicative of completion of a self-refresh cycle on data bits read out from memory cells coupled with one of said word lines to be activated, g-3) a latch circuit coupled with a second input terminal assigned to said external column address strobe signal for producing an internal column address strobe signal, a second complementary signal of said internal column address strobe signal, and producing a first enable signal on the basis of said first and second complementary signals and said internal column address strobe signal in said standard mode of operation, g-4) a first monitor circuit responsive to said first and second complementary signals, and producing a third enable signal when said external column address strobe signal is shifted from said active level to said inactive level in said third sequence, g-5) a second monitor circuit enabled with said third enable signal in said diagnostic mode, and responsive to said first and second complementary signals for producing said second enable signal when said external column address strobe signal is shifted from said inactive level to said active level in said third sequence, said second monitor circuit further being responsive to said completing signal for producing an instruction signal in said autorefreshing mode, g-6) a disabling circuit responsive to said instruction signal, and producing a disable signal in said autorefreshing mode for allowing said first signal path to produce said interrupt signal, and g-7) an activation signal generator enabled with one of said first and second enable signals, and responsive to said ready signal for producing said activation signal.

5. A dynamic random access memory device as set forth in claim 1, in which said plurality of external control signals are an external row address strobe signal, an external column address strobe signal and an external write enable signal, and in which said self-refresh controller comprises g-1) a first signal path coupled with a first input terminal assigned to said external row address strobe signal for producing an internal row address strobe signal, a first complementary signal of said internal row address strobe signal and a trigger signal, g-2) a timing generator responsive to said trigger signal, and counting a predetermined time period for producing a ready signal when said predetermined time period is expired, g-3) a first latch circuit coupled with a second input terminal assigned to said external column address strobe signal for producing an internal column address strobe signal, a second complementary signal of said internal column address strobe signal, and producing a first enable signal on the basis of said first and second complementary signals and said internal column address strobe signal in said standard mode of operation, g-4) a first monitor circuit responsive to said first and second complementary signals, and producing a third enable signal when said external column address strobe signal is shifted from said active level to said inactive level in said third sequence, g-5) a second monitor circuit coupled with a third input terminal assigned to said external write enable signal, and enabled with said third enable signal for producing said second enable signal when said external write enable signal is shifted from said inactive level to said active level in said third sequence, said external write enable signal remaining in said inactive level in said second sequence so as not to produce said second enable signal, and g-6) an activation signal generator enabled with one of said first and second enable signals, and responsive to said ready signal for producing said activation signal.

* * * * *

UNITED STATES PATENT AND TRADEMARK OFFICE
CERTIFICATE OF CORRECTION

PATENT NO. : 5,270,982
DATED : December 14, 1993
INVENTOR(S) : SHiroshi WATANABE Page 1 of 2

It is certified that error appears in the above-indentified patent and that said Letters Patent is hereby corrected as shown below:

| | | |
|---|---|---|
| Col. 2, | line 22, | delete "lie" and insert --line--. |
| Col. 3, | line 28, | delete "bee" and insert --see--. |
| Col. 4, | line 16, | delete "in Consistent" and insert --inconsistent--. |
| Col. 9, | line 40, | delete "rests" and insert --resets--. |
| Col. 10, | line 7, | delete "hereof" and insert --thereof--. |
| Col. 11, | line 38, | delete the 1st occurrence of "from". |
| Col. 12, | line 54, | delete "to as"; |
| Col. 12, | line 63, | delete "circuti" and insert --circuit--. |
| Col. 13, | line 7, | delete "levle" and insert --level--; |
| Col. 13, | line 12, | delete "siganl" and insert --signal--; |
| Col. 13, | line 15, | delete both occurrences of "siganl" and insert --signal--; |
| Col. 13, | line 18, | delete "th ehigh" and insert --the high--; |
| Col. 13, | line 23, | delete "with" and insert --width--; |
| Col. 13, | line 26, | delete "embodiemnt" and insert --embodiment--; |

UNITED STATES PATENT AND TRADEMARK OFFICE
CERTIFICATE OF CORRECTION

PATENT NO. : 5,270,982
DATED : December 14, 1993
INVENTOR(S) : Hiroshi WATANABE

It is certified that error appears in the above-indentified patent and that said Letters Patent is hereby corrected as shown below:

Col. 13, line 29, delete "levle" and insert --level--;
Col. 13, line 39, delete "siganl" and insert --signal--;
Col. 13, line 46, delete "embodiemnt" and insert --embodiment--;
Col. 13, line 54, delete "embodiemnt" and insert --embodiment--;
Col. 13, line 58, delete "embodiemnt" and insert --embodiment--.
Col. 14, line 28, delete "ad" and insert --and--.

Signed and Sealed this

Fourth Day of October, 1994

Attest:

BRUCE LEHMAN

Attesting Officer          Commissioner of Patents and Trademarks